(12) United States Patent
Liang et al.

(10) Patent No.: US 10,319,876 B2
(45) Date of Patent: Jun. 11, 2019

(54) METHOD OF FORMING MICRO LIGHT EMITTING DIODE

(71) Applicant: Wuhan China Star Optoelectronics Technology Co., Ltd., Wuhan, Hubei (CN)

(72) Inventors: Bo Liang, Guangdong (CN); Wei Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 51 days.

(21) Appl. No.: 15/327,133

(22) PCT Filed: Jan. 5, 2017

(86) PCT No.: PCT/CN2017/070195
§ 371 (c)(1),
(2) Date: Jan. 18, 2017

(87) PCT Pub. No.: WO2018/072345
PCT Pub. Date: Apr. 26, 2018

(65) Prior Publication Data
US 2018/0212096 A1    Jul. 26, 2018

(30) Foreign Application Priority Data
Oct. 19, 2016    (CN) .......................... 2016 1 0910337

(51) Int. Cl.
*H01L 33/06* (2010.01)
*H01L 33/00* (2010.01)
(Continued)

(52) U.S. Cl.
CPC .......... *H01L 33/007* (2013.01); *H01L 27/156* (2013.01); *H01L 33/06* (2013.01);
(Continued)

(58) Field of Classification Search
CPC ........ H01L 33/007; H01L 33/06; H01L 33/24
See application file for complete search history.

(56) References Cited

U.S. PATENT DOCUMENTS 7,906,803 B2    3/2011    Shioya et al.
9,385,266 B2 *  7/2016    Cha .......................... H01L 33/08
(Continued)

FOREIGN PATENT DOCUMENTS

CN    102544279 A    7/2012
CN    102593305 A    7/2012
(Continued)

*Primary Examiner* — Quoc D Hoang
(74) *Attorney, Agent, or Firm* — Andrew C. Cheng

(57) ABSTRACT

The present disclosure proposes a micro LED and a method of forming the same. After a body of layers to structure a PN junction is formed sequentially on the outer wall of a buffer layer column, a first electrode is formed on the outer side of the body of layers that structured the PN junction. A second electrode is formed on the inner side of the body of layers that structured the PN junction after the buffer layer column is removed. The first electrode and second electrode are insulating to each other in areas outside of the body of layers structuring the PN junction. The micro LED formed is of a tube structure. The tube-structured micro LED can effectively lower the impedance imposed by the body of layers structuring the PN junction between the first and second electrodes, and thus enhance conductivity and illumination efficiency of the micro LED.

10 Claims, 4 Drawing Sheets

(51) Int. Cl.
    *H01L 33/42*     (2010.01)
    *H01L 27/15*     (2006.01)
    *H01L 33/32*     (2010.01)
    *H01L 33/24*     (2010.01)
    *H01L 33/20*     (2010.01)

(52) U.S. Cl.
    CPC ............ *H01L 33/24* (2013.01); *H01L 33/325* (2013.01); *H01L 33/42* (2013.01); *H01L 33/20* (2013.01)

(56) References Cited

U.S. PATENT DOCUMENTS

| | | |
|---|---|---|
| 2008/0305568 A1 | 12/2008 | Huang et al. |
| 2015/0118777 A1 | 4/2015 | Seo et al. |
| 2015/0325745 A1 | 11/2015 | Hwang et al. |
| 2017/0372927 A1 | 12/2017 | Schuele et al. |

FOREIGN PATENT DOCUMENTS

| | | |
|---|---|---|
| CN | 103035808 A | 4/2013 |
| CN | 103337512 A | 10/2013 |
| CN | 104112802 A | 10/2014 |
| CN | 105932121 A | 9/2016 |
| CN | 106229394 A | 12/2016 |

\* cited by examiner

METHOD OF FORMING MICRO LIGHT EMITTING DIODE

BACKGROUND OF THE DISCLOSURE

1. Field of the Disclosure

The present disclosure is related to the field of semiconductor technology, and more particularly to a micro light emitting diode (LED), a method of forming the same and LED display.

2. Description of the Related Art

The structure of a micro LED display is a micro-sized LED array, meaning that the structure design of LED is thinned, micro-sized and made into an array, and the distance between pixel points is narrowed from millimeter to micrometer. It works the same as an outdoor large-size LED screen, with which each pixel can address and drive to illuminate individually. Comparing with an organic light-emitting display (OLED) that also illuminates spontaneously, a micro LED performs better in terms of stability of materials and longevity.

Currently, micro LED unit has two basic structures, horizontal structure and vertical structure. Comparing with a horizontally-structured micro LED, a vertically-structured micro LED can provide larger area for illumination and improve output coupling efficiency. However, the complicated geometric structure of a vertically-structured micro LED makes it difficult to tune the colors, and the monochromaticity is more likely to deteriorate.

SUMMARY OF THE DISCLOSURE

An objective of the current disclosure is to provide a micro LED and a method of forming the same so to improve illumination efficiency and problems related to mono-chromaticity with conventional arts.

According to the present disclosure, a method of forming a micro light emitting diode (LED) comprises: providing a substrate; depositing and forming a first buffer layer on the substrate; etching pre-determined spots on the first buffer layer to expose the substrate on the pre-determined spots; growing hollow micrometer/nanometer tubes on the pre-determined spots on the substrate to get a buffer layer column; growing a n-GaN layer on the outer wall of the buffer layer column; depositing and forming a second buffer layer on the n-GaN layer; etching the second buffer layer to expose parts of the n-GaN layer; forming a multiple quantum well (MQW) layer and a p-GaN layer sequentially on the n-GaN layer to get a body of layers structuring the PN junction; forming a first electrode on the outer side of the body of layers structuring the PN junction, and after removing the buffer layer column, forming a second electrode on the inner side of the body of layers structuring the PN junction, with the first electrode and second electrode insulating to each other in areas outside the body of layers structuring the PN junction.

Optionally, the substrate is a Si-doped n-GaN/Al2O3 substrate, and the first buffer layer is a SiO2 layer.

Optionally, the pre-determined spots are structured as periodic lattice, so to realize even placement of hollow micrometer/nanometer tube structures.

Optionally, the buffer layer column is ZnO micrometer/nanometer tubes.

Optionally, depositing and forming the second buffer layer on the n-GaN layer, and etching the second buffer layer to expose parts of the n-GaN layer comprises: depositing SiO2 on the n-GaN layer, and etching parts of the SiO2 to expose parts of the n-GaN layer; depositing polymethyl methacrylate (PMMA) on the SiO2 and etching parts of the PMMA to expose parts of the n-GaN layer.

Optionally, treatments taken in between each two neighboring layers when forming the MQW layer and p-GaN layer sequentially on the n-GaN layer further comprise: forming a third buffer layer to cover lower structures; etching parts of the third buffer layer.

Optionally, the exposed parts of n-GaN layer, MQW layer and p-GaN layer are of different heights.

Optionally, the MQW layer is aµ-InxGa1-xN/µ-GaN multiple quantum layer, and the p-GaN layer is a Mg-doped p-GaN layer.

Optionally, steps taken after forming the MQW layer and p-GaN layer sequentially on the n-GaN layer further comprise annealing in an ambiance of noble gases.

Optionally, forming the first electrode on the outer side of the body of layers structuring the PN junction further comprises: coating and solidifying PI liquid on the substrate and the body of layers structuring the PN junction; etching the PI liquid on top of the body of layers structuring the PN junction to expose the body of layers structuring the PN junction; depositing Ni/Au metal layer and Ag metal layer on the substrate and the body of layers structuring the PN junction to get the first electrode; removing the buffer layer column and forming the second electrode on the inner side of the body of layers structuring the PN junction further comprising: removing the substrate; etching the first buffer layer and the buffer layer column served as sacrificing layers; turning the body of layers structuring the PN junction and depositing the Ti/Au metal layer and ITO metal layer to get the second electrode.

According to the present disclosure, a micro light emitting diode (LED) comprises: a first electrode and a second electrode wrapped around by the first electrode, with the first and second electrodes insulating to each other; a body of layers structuring the PN junction filled between the first and second electrodes, wherein the body of layers structuring the PN junction further comprises a n-GaN layer, a multiple quantum well (MQW) layer and a p-GaN layer, growing from the inner most to the outer most.

Optionally, the micro LED is of a tube structure.

Optionally, the exposed parts of the n-GaN layer, MQW layer and p-GaN layer are of different heights.

Optionally, the first electrode is a Ni/Au metal layer and Ag layer, and the second electrode is a Ti/Au metal layer and ITO metal layer.

Optionally, the MQW layer is aµ-InxGa1-xN/µ-GaN multiple quantum layer, and the p-GaN layer is a Mg-doped p-GaN layer.

According to the present disclosure, a micro light emitting diode (LED) display comprising the micro light emitting diode (LED) as provided above.

Optionally, the micro LED is of a tube structure.

Optionally, the exposed parts of the n-GaN layer, MQW layer and p-GaN layer are of different heights.

Optionally, the first electrode is a Ni/Au metal layer and Ag layer, and the second electrode is a Ti/Au metal layer and ITO metal layer.

Optionally, the MQW layer is aµ-InxGa1-xN/µ-GaN multiple quantum layer, and the p-GaN layer is a Mg-doped p-GaN layer.

The present disclosure has the following beneficial effects. After a body of layers to structure a PN junction is formed sequentially on the outer wall of a buffer layer column, a first electrode is formed on the outer side of the body of layers that structured the PN junction. A second electrode is formed on the inner side of the body of layers that structured the PN junction after the buffer layer column is removed. The first electrode and second electrode are insulating to each other in areas outside of the body of layers structuring the PN junction. The micro LED thus formed is of a tube structure. The tube-structured micro LED can effectively lower the impedance imposed by the body of layers structuring the PN junction between the first and second electrodes, and thus enhance conductivity and illumination efficiency of the micro LED. At the same time, the micro/nano tube structure increases the effective areas of the PN junction and current density. Therefore, it effectively improves the illumination efficiency and mono-chromaticity of the micro LED.

DETAILED DESCRIPTION OF PREFERRED EMBODIMENTS

These and other features, aspects and advantages of the present disclosure will become understood with reference to the following description, appended claims and accompanying figures.

Figure 1:
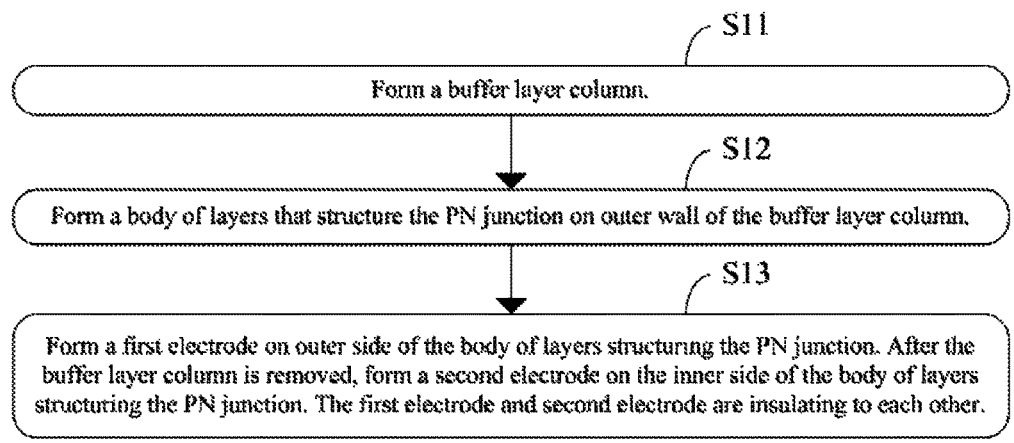
FIG. 1 illustrates a flow chart of a method of forming a micro LED according to a first embodiment of the present disclosure.

FIG. 1 shows a flow chart of a method of forming a micro LED according to a first embodiment of the present disclosure. The method includes:

S11: forming a buffer layer column.

The buffer layer column is formed by low-temperature growth or etching. It can effectively solve difficulties resulted from a mismatch between lattice constants and thermal expansion coefficients of materials in base layer and n-GaN layer. In addition, it can also support the body of layers structuring the PN junction.

S12: forming a body of layers that structure the PN junction on the outer wall of the buffer layer column.

A body of layers that structure the PN junction is formed through methods such as metal-organic chemical vapor deposition (MOCVD) on the outer wall of the buffer layer column, surrounding the column.

S13: forming a first electrode on the outer side of the body of layers structuring the PN junction. And, after the buffer layer column is removed, forming a second electrode on the inner side of the body of layers structuring the PN junction. The first electrode and second electrode are insulating to each other.

The present embodiment forms the first electrode on the outer side of the body of layers structuring the PN junction after it is formed sequentially on the outer wall of a buffer layer column. A second electrode is formed on the inner side of the body of layers that structured the PN junction after the buffer layer column is removed. The first electrode and second electrode are insulating to each other in areas outside of the body of layers structuring the PN junction. The micro LED thus formed is of a tube structure. The tube-structured micro LED can effectively lower the impedance imposed by the body of layers structuring the PN junction between the first and second electrodes, and thus enhance conductivity and illumination efficiency of the micro LED. At the same time, the micro/nano tube structure increases the effective areas of the PN junction and current density. Therefore, it effectively improves the illumination efficiency of the micro LED and mono-chromaticity.

Figure 2:
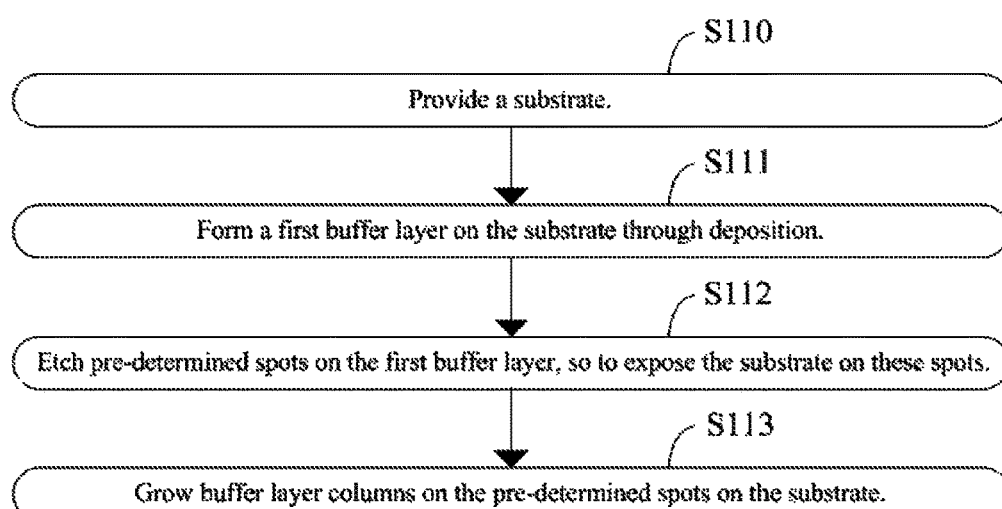
FIG. 2 illustrates a flow chart of detailed steps of the step S11 in FIG. 1.

FIG. 2 shows steps of step 11 in FIG. 1 as in a specific example.

S110: providing a substrate. Materials of the substrate can be sapphire (Al2O3), silicon (Si) or silicon carbide (SiC). Si-doped n-GaN/Al2O3 are the preferred materials of a substrate formed through metal-organic vapor-phase epitaxy (MOVPE).

S111: forming a first buffer layer on the substrate through deposition. The first buffer layer is a SiO2 layer formed through plasma enhanced chemical vapor deposition (PECVD) on a Si-doped n-GaN/Al2O3 base. When applied in an example, the SiO2 layer can be 50-200 nm thick, e.g. 100 nm.

S112: etching pre-determined spots on the first buffer layer, so to expose the substrate on these spots. Needed SiO2 patterns are formed by glue coating, exposure, development and etching, so to grow buffer layer columns on these specific spots. No specific limit is imposed on the shape of the patterns, which can be determined by the shape of the buffer layer columns that will grow later.

S113: growing buffer layer columns on the pre-determined spots on the substrate. Materials of the buffer layer columns can be aluminum nitride (AlN), gallium nitride (GaN), SiC and zinc oxide (ZnO). Preferably, the buffer layer column is a ZnO micrometer/nanometer tube. ZnO micrometer/nanometer tubes are grown on the pre-determined spots on the substrate through physical vapor deposition (PVD), and a plurality of ZnO micrometer/nanometer tubes are placed with a fixed distance in between each tube. The shape of ZnO micrometer/nanometer tubes are the same as that of the SiO2 patterns. When applied in an example, the structure of the plurality of ZnO micrometer/nanometer tubes can be a periodic lattice, to attain to an even placement of the structure of the plurality of ZnO micrometer/nanometer tubes. It ensures that they are distributed evenly, and thus the micro LED will illuminate evenly.

Figure 3:
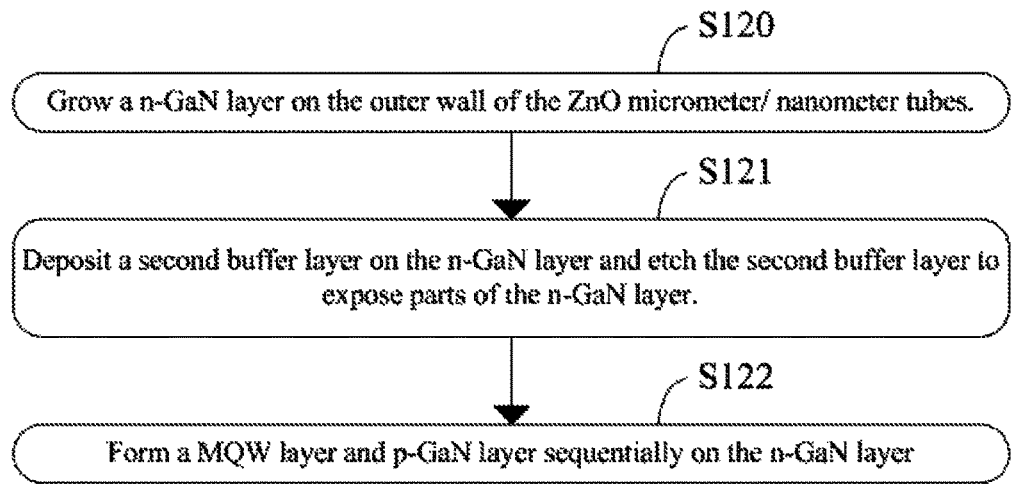
FIG. 3 illustrates a flow chart of detailed steps of the step S12 in FIG. 1.

FIG. 3 shows steps of step 12 in FIG. 1 as in a specific example.

S120: growing a n-GaN layer on the outer wall of the ZnO micrometer/nanometer tubes through methods such as MOCVD.

S121: depositing a second buffer layer on the n-GaN layer and etching the second buffer layer to expose parts of the n-GaN layer. It includes depositing a certain thickness of SiO2 on the n-GaN layer. When applied in an example, the thickness of SiO2 is 50-200 nm, e.g. 50 nm. It also includes etching part of the SiO2 on top of the second buffer layer to expose parts of the n-GaN. A certain thickness of polymethyl methacrylate (PMMA) is applied to cover and shield ZnO/n-GaN/SiO2. When applied in an example, the thickness of the PMMA is 1 um and parts of it were etched. The SiO2 layer and PMMA layer serve as masks to shield only parts of the n-GaN layer after the etching and are not kept in the end structure of the micro LED. A multiple quantum well (MQW) layer and p-GaN layer are formed sequentially on the parts where the n-GaN layer is exposed.

S122: forming a MQW layer and p-GaN layer sequentially on the n-GaN layer through MOCVD. During the forming process, one treatment is taken between each neighboring layers: forming a third buffer layer so to cover and shield lower parts of the structure, and then etching part of the third buffer layer so to form a p-GaN layer on top of the parts where the MQW layer is exposed.

In the present embodiment, the height of the parts where n-GaN layer, MQW layer and p-GaN layer, from the inner most to the outer most, are exposed is different because of the first, second and third buffer layers.

In the present embodiment, MQWs are μ-InxGa1-xN/μ-GaN MQWs, and p-GaN is a Mg-doped p-GaN layer. Steps taken after MQWs layer and p-GaN layer are formed sequentially on the n-GaN layer include annealing in noble gas ambiance, such as gas nitrogen.

Figure 4:
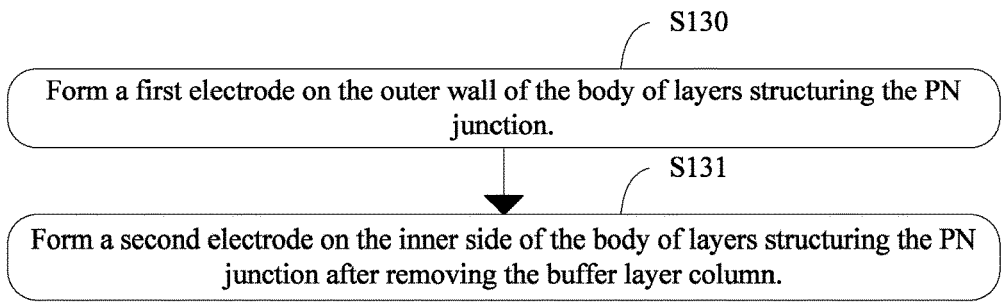
FIG. 4 illustrates a flow chart of detailed steps of the step S13 in FIG. 1.

FIG. 4 shows steps of step 13 in FIG. 1 as in a specific example.

S130: forming a first electrode on the outer wall of the body of layers structuring the PN junction.

S131: forming a second electrode on the inner side of the body of layers structuring the PN junction after removing the buffer layer column. The first electrode are deposited Ni/Au metal layer and Ag metal layer, and the second electrode are deposited Ti/Au metal layer and indium tin oxide (ITO) layer.

Figure 5:
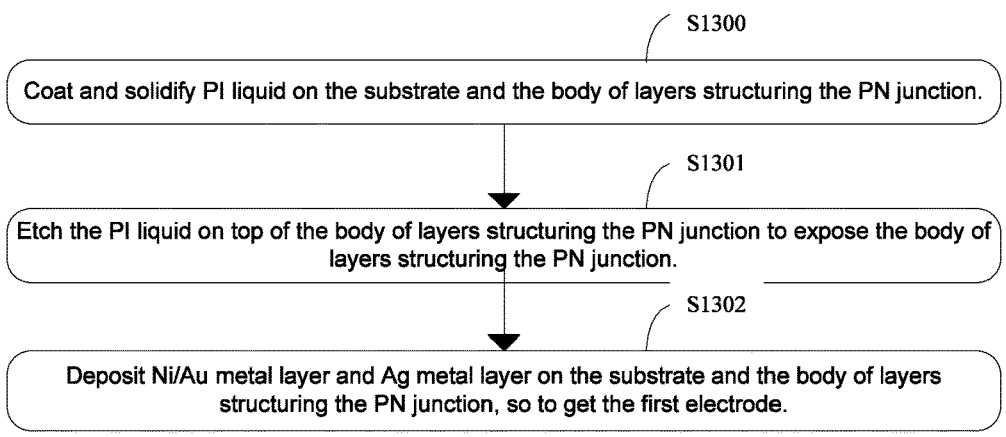
FIG. 5 illustrates a flow chart of detailed steps of the step S130 in FIG. 4.

FIG. 5 shows that steps of S130 in FIG. 4 as in a specific example further include:

S1300: coating and solidifying polyimide (PI) liquid on the substrate and the body of layers structuring the PN junction, in order to separate the first electrode formed on the outer wall of the body of layers structuring the PN junction and the second electrode formed on the inner side of the body of layers structuring the PN junction, so that the first and second electrodes are insulating to each other. The PI liquid can also fix and control the direction of the micro LED.

S1301: etching the PI liquid on top of the body of layers structuring the PN junction to expose the body of layers structuring the PN junction.

S1302: depositing Ni/Au metal layer and Ag metal layer on the substrate and the body of layers structuring the PN junction, so to get the first electrode. In an embodiment, the Ni/Au metal layer can be 5-20 nm thick, e.g. 10 nm. The Ag metal layer can be several micrometer thick.

Figure 6:
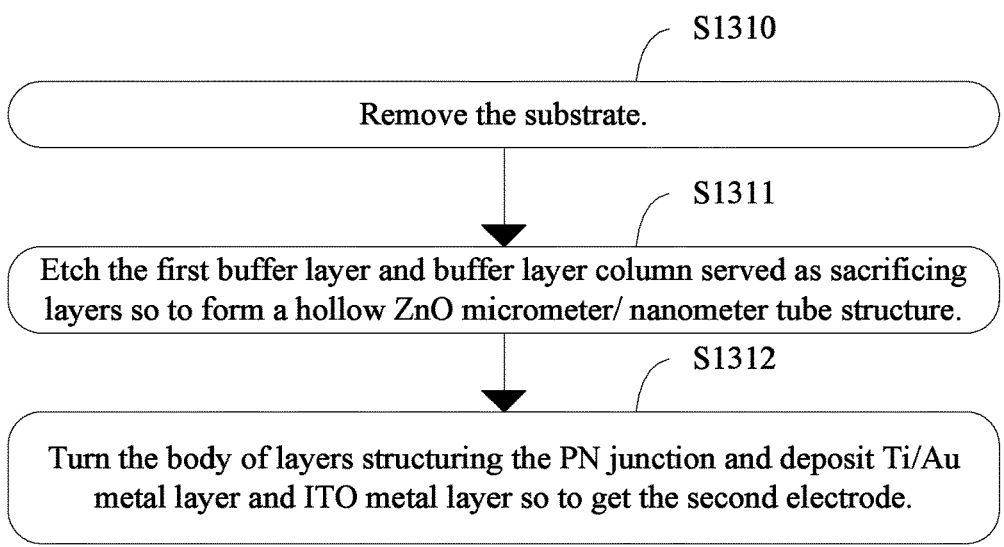
FIG. 6 illustrates a flow chart of detailed steps of the step S131 in FIG. 4.

FIG. 6 shows that steps of S131 in FIG. 4 as in an example further includes:

S1310: removing the substrate.

S1311: etching the first buffer layer and buffer layer column served as sacrificing layers so to form a hollow ZnO micrometer/nanometer tube structure.

S1312: turning the body of layers structuring the PN junction and depositing Ti/Au metal layer and ITO metal layer so to get the second electrode. When applied in an example, the Ti/Au metal layer is 2-5 nm thick, and the ITO layer is 800-1200 nm thick.

The thickness of each layer, depositing method of each layer and materials of metal electrodes illustrated above are just examples. They can be decided based on actual needs of a specific scenario.

In other embodiments, materials of N-type and P-type semiconductors can be but are not limited to indium gallium nitride (InGaN), aluminum gallium indium phosphide (AlGaInP), aluminum gallium arsenide (GaAlAs) or a combination of any two of these materials.

When implementing the embodiment, after the body of layers structuring the PN junction is formed sequentially on the outer wall of the buffer layer column, a first electrode is formed on the outer side of the body of layers that structured the PN junction. A second electrode is formed on the inner side of the body of layers that structured the PN junction after the buffer layer column is removed. The micro LED thus formed is with metal electrodes and hollow. The micro LED makes use of the hollow geometric shape to form metal electrodes and effectively lowers the impedance between the metal electrodes, and thus enhances conductivity and illumination efficiency. At the same time, the micro/nano tube structure increases the effective areas of the PN junction and current density. Therefore, it effectively improves the illumination efficiency of the micro LED and mono-chromaticity.

Figure 7:
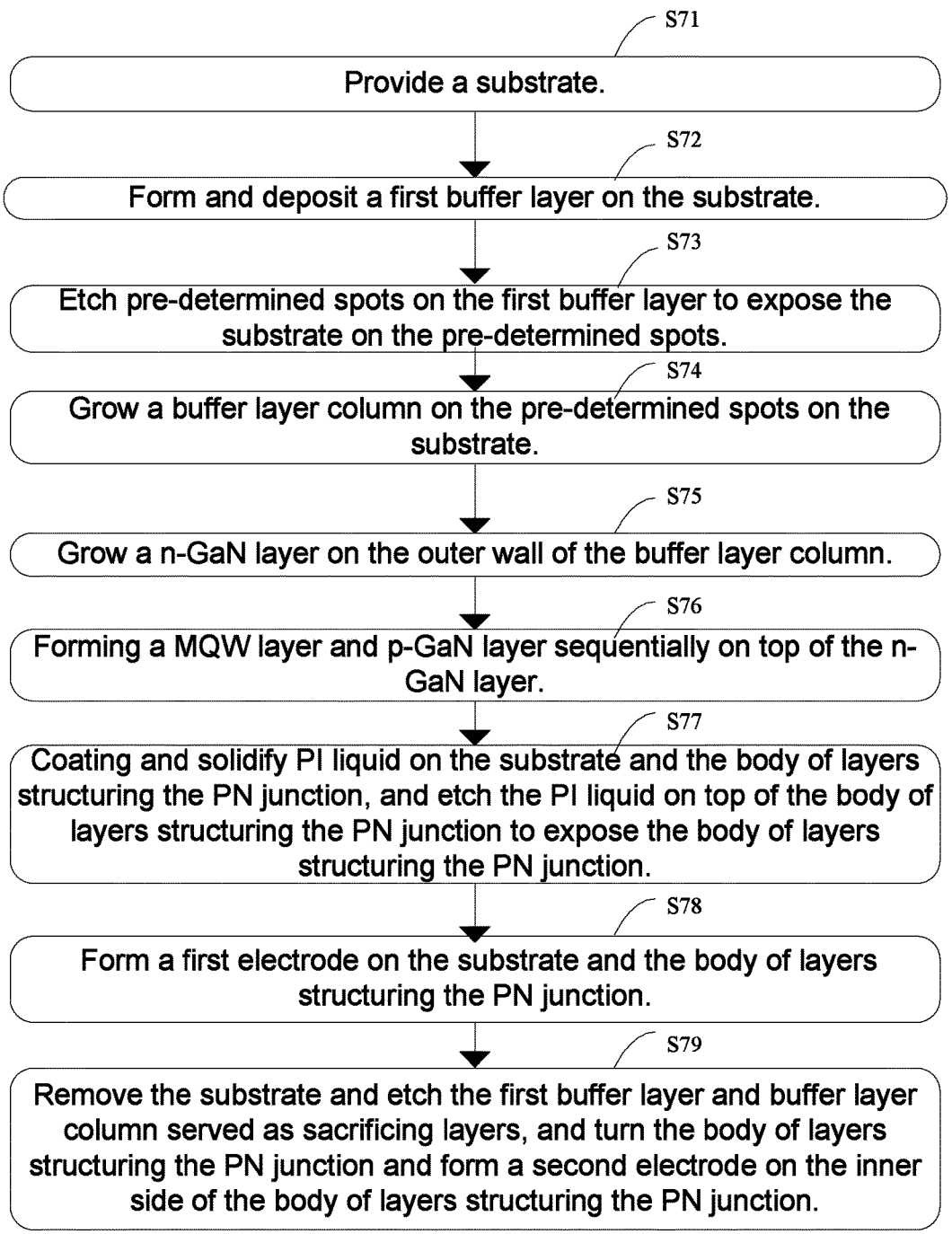
FIG. 7 illustrates a flow chart of a method of forming a micro LED according to a second embodiment of the present disclosure.

FIG. 7 shows a flow chart of a second embodiment of a method of forming the micro LED of the present disclosure.

S71: providing a substrate.

S72: forming and depositing a first buffer layer on the substrate.

S73: etching pre-determined spots on the first buffer layer to expose the substrate on the pre-determined spots.

S74: growing a buffer layer column on the pre-determined spots on the substrate.

S75: growing a n-GaN layer on the outer wall of the buffer layer column.

S76: forming a MQW layer and p-GaN layer sequentially on top of the n-GaN layer.

S77: coating and solidifying PI liquid on the substrate and the body of layers structuring the PN junction, and etching the PI liquid on top of the body of layers structuring the PN junction to expose the body of layers structuring the PN junction.

S78: forming a first electrode on the substrate and the body of layers structuring the PN junction.

S79: removing the substrate and etching the first buffer layer and buffer layer column served as sacrificing layers, and turning the body of layers structuring the PN junction and forming a second electrode on the inner side of the body of layers structuring the PN junction.

Please refer to the description in the first embodiment of the method of forming the micro LED of the present disclosure for specifics about materials, functions and thickness of each layer in the present embodiment. No more explanation is provided here. The thickness and deposition method of each layer, and materials of metal electrode layers are just examples, and can be decided based on actual needs of a specific scenario. In other embodiments, materials of N-type and P-type semiconductors can be but are not limited to InGaN, AlGaInP, GaAlAs or a combination of any two of these materials.

Figure 8:
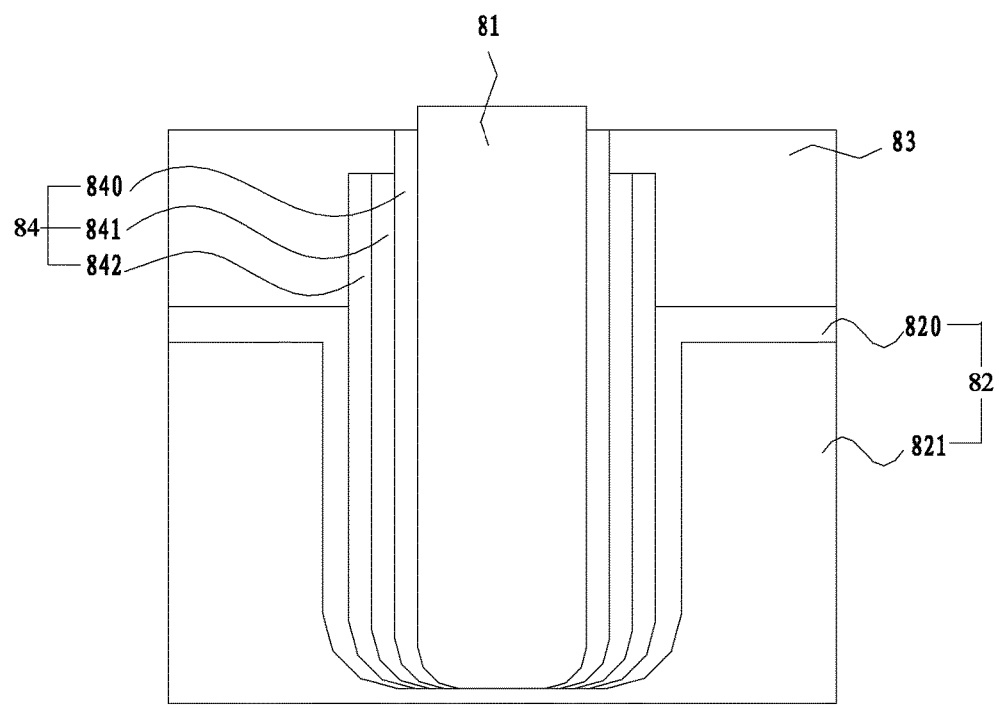
FIG. 8 illustrates a schematic diagram of a micro LED according to a embodiment of the present disclosure.

FIG. 8 is a structural diagram of an embodiment of the micro LED of the present disclosure. It includes a first electrode 81, a second electrode 82, a PI layer 83 and a body of layers 84 structuring a PN junction.

The second electrode 82 is installed and wrapped around by the first electrode 81. The PI layer 83 is disposed on top of the second electrode 82 so to insulate the first electrode 81 against the second electrode 82. The body of layers 84 structuring the PN junction is filled between the first electrode 81 and second electrode 82.

The first electrode is a deposited Ti/Au metal layer and ITO metal layer. The second electrode is a Ni/Au metal layer 820 and Ag metal layer 821. The body of layers 84 structuring the PN junction further includes a n-GaN layer 840, a MQW layer 841 and a p-GaN layer 842, growing from the inner most to the outer most.

Please refer to the description in the first embodiment of the method of forming the micro LED of the present disclosure for specifics about materials, functions and thickness of each layer in the present embodiment. No more explanation is provided here. The thickness, size and position of each layer are just examples, and can be decided based on actual needs of a specific scenario. In other embodiments, materials of N-type and P-type semiconductors can be but are not limited to InGaN, AlGaInP, GaAlAs or a combination of any two of these materials.

Figure 9:
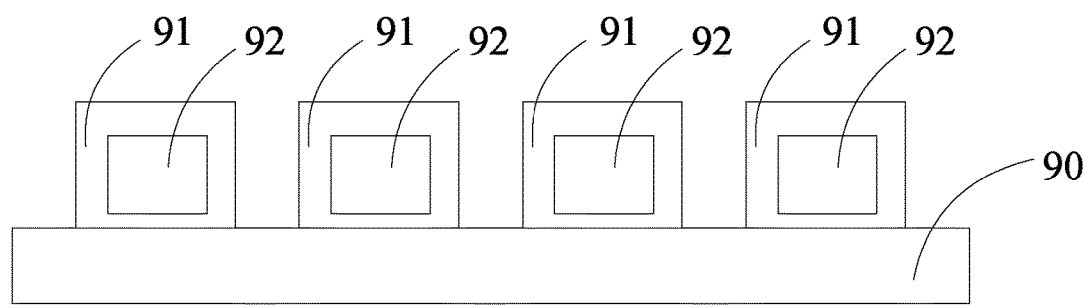
FIG. 9 illustrates a schematic diagram of a micro LED display according to a embodiment of the present disclosure.

FIG. 9 is a structural diagram of an embodiment of the micro LED of the present disclosure. It includes a substrate 90, a sub-pixel area 91 installed on the substrate 90, and a micro LED 92 installed within the sub-pixel area 91.

The sub-pixel area 91 is arranged in array. The structure of the micro LED 92 is shown in FIG. 8.

The size and relative position of the sub-pixel area 91 and the micro LED 92 are schematic in the figure. They can be decided based on actual needs of a specific scenario.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalent.

What is claimed is:

1. A method of forming a micro light emitting diode (LED), comprising:
   providing a substrate;
   depositing and forming a first buffer layer on the substrate;
   etching pre-determined spots on the first buffer layer to expose the substrate on the pre-determined spots;
   growing hollow micrometer/nanometer tubes on the pre-determined spots on the substrate to get a buffer layer column;
   growing a n-GaN layer on an outer wall of the buffer layer column;
   depositing and forming a second buffer layer on the n-GaN layer;
   etching the second buffer layer to expose parts of the n-GaN layer;
   forming a multiple quantum well (MQW) layer and a p-GaN layer sequentially on the n-GaN layer to get a body of layers structuring the PN junction;
   forming a first electrode on an outer side of the body of layers structuring the PN junction, and after removing the buffer layer column, forming a second electrode on an inner side of the body of layers structuring the PN junction, with the first electrode and second electrode insulating to each other in areas outside the body of layers structuring the PN junction.

2. The method of claim 1, wherein the substrate is a Si-doped n-GaN/Al2O3 substrate, and the first buffer layer is a SiO2 layer.

3. The method of claim 1, wherein the pre-determined spots are structured as periodic lattice, so to realize even placement of hollow micrometer/nanometer tube structures.

4. The method of claim 1, wherein the buffer layer column is ZnO micrometer/nanometer tubes.

5. The method of claim 1, wherein depositing and forming the second buffer layer on the n-GaN layer, and etching the second buffer layer to expose parts of the n-GaN layer comprises:
   depositing SiO2 on the n-GaN layer, and etching parts of the SiO2 to expose parts of the n-GaN layer;
   depositing polymethyl methacrylate (PMMA) on the SiO2 and etching parts of the PMMA to expose parts of the n-GaN layer.

6. The method of claim 1, wherein treatments taken in between each two neighboring layers when forming the MQW layer and p-GaN layer sequentially on the n-GaN layer further comprise:
   forming a third buffer layer to cover lower structures;
   etching parts of the third buffer layer.

7. The method of claim 6, wherein the exposed parts of n-GaN layer, MQW layer and p-GaN layer are of different heights.

8. The method of claim 1, wherein the MQW layer is aµ-InxGa1-xN/µ-GaN multiple quantum layer, and the p-GaN layer is a Mg-doped p-GaN layer.

9. The method of claim 1, wherein steps taken after forming the MQW layer and p-GaN layer sequentially on the n-GaN layer further comprise annealing in an ambiance of noble gases.

10. The method of claim 1, wherein forming the first electrode on the outer side of the body of layers structuring the PN junction further comprises:
   coating and solidifying PI liquid on the substrate and the body of layers structuring the PN junction;
   etching the PI liquid on top of the body of layers structuring the PN junction to expose the body of layers structuring the PN junction;
   depositing Ni/Au metal layer and Ag metal layer on the substrate and the body of layers structuring the PN junction to get the first electrode;
   removing the buffer layer column and forming the second electrode on the inner side of the body of layers structuring the PN junction further comprising:
   removing the substrate;
   etching the first buffer layer and the buffer layer column served as sacrificing layers;
   turning the body of layers structuring the PN junction and depositing the Ti/Au metal layer and ITO metal layer to get the second electrode.

* * * * *